United States Patent
Young

(10) Patent No.: US 7,259,453 B2
(45) Date of Patent: Aug. 21, 2007

(54) HEXAGONAL ARRAY STRUCTURE FOR BALL GRID ARRAY PACKAGES

(75) Inventor: Dave W. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 10/787,563

(22) Filed: Feb. 24, 2004

(65) Prior Publication Data

US 2005/0186769 A1   Aug. 25, 2005

(51) Int. Cl.
*H01L 23/48* (2006.01)
(52) U.S. Cl. .................. 257/697; 257/778; 257/784; 257/786
(58) Field of Classification Search ........ 257/737–738, 257/779–778
See application file for complete search history.

(56) References Cited

U.S. PATENT DOCUMENTS

| 6,057,596 | A  | * | 5/2000 | Lin et al. ..................... 257/697 |
| 6,268,568 | B1 | * | 7/2001 | Kim ............................. 174/250 |
| 6,930,381 | B1 | * | 8/2005 | Cornelius ................... 257/692 |
| 2004/0036176 | A1 | * | 2/2004 | Singh et al. ................. 257/773 |

\* cited by examiner

*Primary Examiner*—Dung A. Le
(74) *Attorney, Agent, or Firm*—Trop, Pruner & Hu, P.C.

(57) ABSTRACT

Solder balls may be arranged in hexagonal array on an integrated circuit package. The hexagonal array may increase the solder ball density, reducing solder ball fatigue. In some embodiments, the hexagonal array may be utilized under the die shadow and an orthogonal array may be used outbound thereof.

8 Claims, 2 Drawing Sheets

HEXAGONAL ARRAY STRUCTURE FOR BALL GRID ARRAY PACKAGES

BACKGROUND

This invention relates generally to packages for electronic devices.

Electronic devices may be packaged in a variety of different package styles. Surface mount packages are particularly desirable because they enable the packages to be secured to printed circuit boards or other devices through the application of heat.

Solder balls may be placed in an array on the underside of the electronic component coupled to lands in the electronic component. These lands are connected by interconnections to the various input and output nodes of the integrated circuit. The balls may be positioned on lands on the printed circuit board. When the structure is heated, the solder balls soften and bond to the lands on the printed circuit board, forming mechanical and electrical connections.

The strength of the connection between the solder balls, the component, and the printed circuit board is an area of considerable concern. Fatigue may occur in these connections. Such fatigue generally results in failure of the electronic device that uses the component.

Thus, there is a need for alternate ways to provide ball grid array packages with improved solder fatigue resistance.

DETAILED DESCRIPTION

Figure 1:
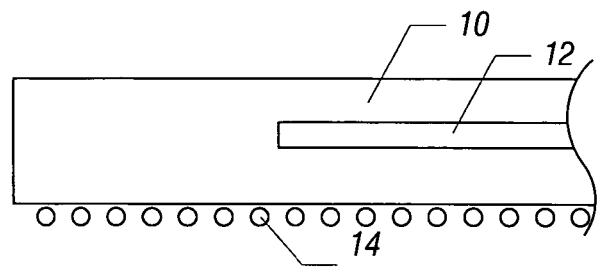
FIG. 1 is a partial, enlarged, cross-sectional view through one embodiment of the present invention.

Referring to FIG. 1, a ball grid array package 10 may include an integrated circuit chip 12. On the underside of the package 10 are a number of solder balls 14. The solder balls 14 outbound of the region underlying the integrated circuit 12 are less prone to metal fatigue failure. However, the solder balls in the region underneath the integrated circuit 12 are particularly prone to fatigue failure.

Figure 2:
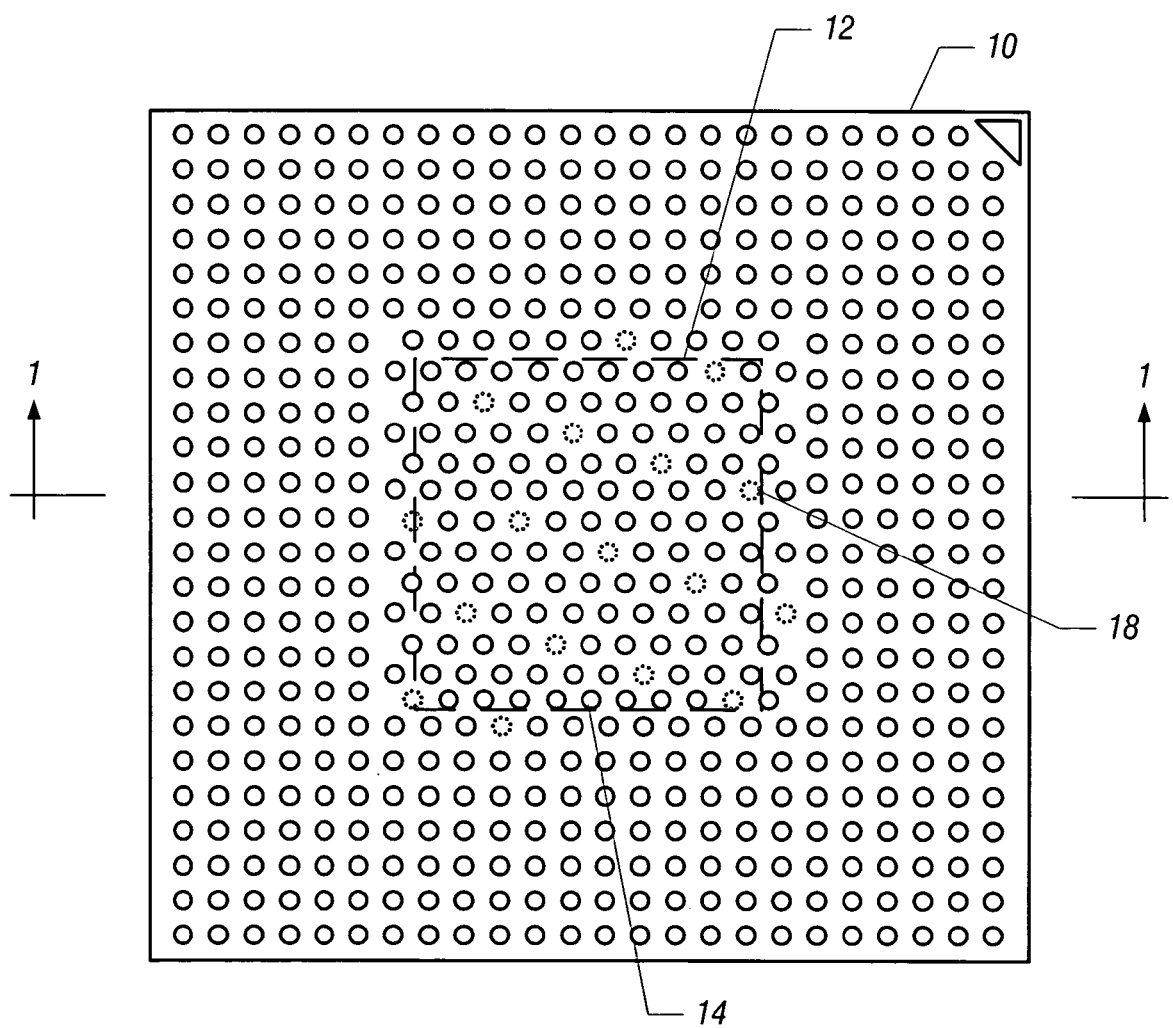
FIG. 2 is a bottom plan view of the embodiment shown in FIG. 1.

Referring to FIG. 2, there are two basic regions of solder balls. There are solder balls 14 underneath the integrated circuit 12 and solder balls 14 outbound thereof. In FIG. 2, the shadow of the integrated circuit 12 is indicated by the dashed rectangle 10.

The solder balls 14 outbound of the shadow region may be arranged in an orthogonal array of rows and columns. Solder balls 14 inbound of the shadow region may be arranged in a hexagonal array. This arrangement may increase solder ball density in the sensitive region underneath the integrated circuit 12.

Increasing solder ball density without a change in minimum ball pitch may, in some embodiments, reduce solder fatigue resistance. In some embodiments, solder joint density may be increased by 15 percent without changing pitch.

The hexagonal array may extend the strain over an increased number of solder joints, thereby reducing damage to any single joint and extending fatigue life. This is because solder fatigue resistance is reduced by increasing the total pad area. The benefits of increasing the total pad area may be realized by increasing the total pad area in the high strain region underneath the die shadow in the case of ball grid array packages.

Figure 3:
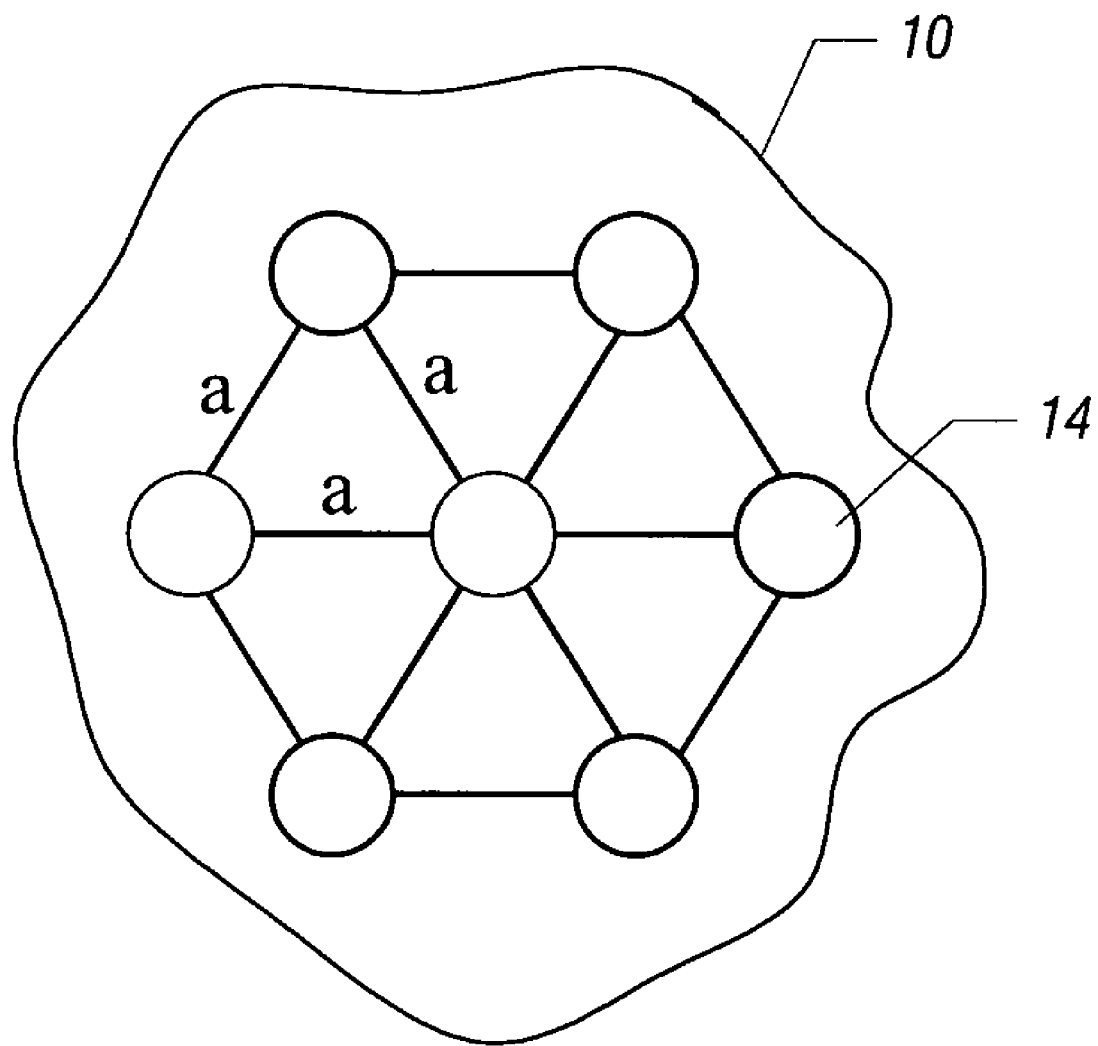
FIG. 3 is a schematic depiction of a portion of the figure shown in FIG. 2 in accordance with one embodiment of the present invention.

Packing density theorems demonstrate that ball density, in terms of balls per unit area, is increased with a hexagonal structure. For example, the structure shown in FIG. 3 has a ball density of 1.15 balls per unit area, whereas an orthogonal array, with the same ball size, would have a density of 1 ball per unit area.

As shown in FIG. 2, the hexagonal portion of the array may, in some cases, extend beyond the die shadow pending signal routing schemes. Via pads 18 may be substitutional with solder pads in some embodiments. Interstitial vias may involve a pad shrink versus an orthogonal array.

Thus, in some embodiments of the present invention, ball density may be increased without changing pitch. Increased ball density may reduce solder fatigue resistance in some embodiments. In some embodiments, it is most advantageous to reduce solder fatigue resistance in the region underneath the integrated circuit die 12.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor integrated circuit device comprising:
    an integrated circuit;
    an integrated circuit package; and
    a plurality of solder balls coupled to said integrated circuit and said package, said balls being more dense under said integrated circuit and less dense around said integrated circuit, wherein solder balls under the integrated circuit are arranged in a hexagonal array.

2. The device of claim 1 wherein solder balls outbound of the region underneath the integrated circuit arc arranged in an orthogonal array.

3. The device of claim 1 including providing some solder balls on said package in an orthogonal array and some solder balls in a hexagonal array.

4. The device of claim 1 including via pads that are substituted for solder pads.

5. The device of claim 1 wherein the solder balls under said integrated circuit have a density of about 1.15 balls per unit of area and the balls not under said integrated circuit have a density of about 1 ball per unit area.

6. An electronic device comprising:
    an integrated circuit;
    an integrated circuit package; and
    a plurality of solder balls coupled to said integrated circuit and said package, said solder balls between said package and said circuit being arranged in a hexagonal array and said solder balls not between the package and the circuit being arranged in an orthogonal array.

7. The device of claim 6 wherein via pads are provided in place of solder pads.

8. The device of claim 6 wherein said bails between the circuit and the board have a density of about 1.15 balls per unit area and said balls not between said circuit and said board having a density of about 1 ball per unit area.

* * * * *

UNITED STATES PATENT AND TRADEMARK OFFICE
CERTIFICATE OF CORRECTION

| | | |
|---|---|---|
| PATENT NO. | : 7,259,453 B2 | Page 1 of 1 |
| APPLICATION NO. | : 10/787563 | |
| DATED | : August 21, 2007 | |
| INVENTOR(S) | : Dave W. Young | |

It is certified that error appears in the above-identified patent and that said Letters Patent is hereby corrected as shown below:

Column 2:
Line 39 Claim 2,, "arc" should be --are--;
Column 2: Line 60 Claim 8, "bails" should be --balls--.

Signed and Sealed this

Twenty-fifth Day of December, 2007

JON W. DUDAS
*Director of the United States Patent and Trademark Office*